(12) United States Patent
Suh (10) Patent No.: US 7,736,971 B2
(45) Date of Patent: Jun. 15, 2010

(54) SEMICONDUCTOR DEVICE AND METHOD OF FABRICATING THE SAME

(75) Inventor: Jung Tak Suh, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 93 days.

(21) Appl. No.: 11/966,399

(22) Filed: Dec. 28, 2007

(65) Prior Publication Data

US 2009/0108317 A1    Apr. 30, 2009

(30) Foreign Application Priority Data

Oct. 30, 2007    (KR) .................. 10-2007-0109840

(51) Int. Cl.
*H01L 21/8242* (2006.01)
(52) U.S. Cl. .................. 438/253; 438/396; 438/397; 257/306
(58) Field of Classification Search .................. 438/244, 438/253, 396–397; 257/306, E27.086, E21.648
See application file for complete search history.

(56) References Cited

U.S. PATENT DOCUMENTS 7,235,452 B2 *  6/2007  Kang et al. .................. 438/396

2003/0129806 A1 *  7/2003  Miki et al. .................. 438/398
2005/0130371 A1 *  6/2005  Cho et al. .................. 438/253

FOREIGN PATENT DOCUMENTS

| KR | 1020050068336 A | 7/2005 |
| KR | 1020060061107 A | 6/2006 |
| KR | 1020060068970 A | 6/2006 |
| KR | 1020070081713 A | 8/2007 |

* cited by examiner

*Primary Examiner*—Theresa T Doan
(74) *Attorney, Agent, or Firm*—Townsend and Townsend and Crew LLP (57) ABSTRACT

A method of fabricating a semiconductor device includes forming a first interlayer insulating film including a storage node contact plug over a semiconductor substrate. A second interlayer insulating film is formed over the first interlayer insulating film and the storage node contact plug. A mask pattern is formed over the second interlayer insulating film to expose a storage node region. The second interlayer insulating film and the first interlayer insulating film is selectively etched to form a recess exposing a portion of the storage node contact plug. A lower storage node is formed in the recess. The storage node includes a concave structure that surrounds the exposed storage node contact plug. A dip-out process is performed to remove the second interlayer insulating film. A dielectric film is formed over the semiconductor substrate including the lower storage node. A plate electrode is deposited over the dielectric film to form a capacitor.

4 Claims, 7 Drawing Sheets

SEMICONDUCTOR DEVICE AND METHOD OF FABRICATING THE SAME

CROSS-REFERENCES TO RELATED APPLICATIONS

The priority of Korean patent application number 10-2007-0109840, filed on Oct. 30, 2007, which is incorporated by reference in its entirety, is claimed.

BACKGROUND OF THE INVENTION

The present invention relates to a semiconductor device. More particularly, the present invention relates to a semiconductor device including a capacitor and a method of fabricating the same.

As semiconductor devices such as a Dynamic Random Access Memory (DRAM) become highly integrated, the cell area is reduced. The reduction of the cell area decreases an area of a cell capacitor. However, the capacitance is required to be more than 25 fF so that the DRAM may be normally operated taking into consideration read-out of the cell, soft errors from alpha particles and a sensing margin of a sense amplifier. The capacitance is proportional to the surface of the electrode and a dielectric constant of a dielectric material that exists between electrodes. However, it is difficult to find out a dielectric material having a high dielectric constant which does not generate a leakage current. As a result, it is necessary to increase the surface of the storage node for highly integrated DRAM.

A DRAM cell comprises of a capacitor for storing charges that represent information and a transistor for addressing charges stored in the capacitor. The transistor formed over a semiconductor substrate includes a gate electrode to control a current flowing between source/drain regions. The charges stored in the capacitor are accessed through the transistor. The capacitance means a capacity of charges stored in the capacitor. As the capacitance is increased, more charge can be stored. The capacitance is represented by followed Equation 1.

$$C = \varepsilon \frac{A}{d} \quad \text{equation 1}$$

where $\varepsilon$ is a dielectric constant determined by the types of dielectric films disposed between two electrodes, d is a distance between the two electrodes, and A is an effective surface of the two electrodes. Referring to Equation 1, the capacitance can be increased by making $\varepsilon$ larger, d smaller, or area A larger. Accordingly, the electrode of the capacitor has been provided with a three-dimensional configuration, e.g., a concave structure or a cylinder structure, to increase the effective area of the electrode.

The capacitor having a concave structure includes a hole where an electrode of the capacitor is formed in an interlayer insulating film, a lower electrode of the capacitor is formed in the inner surface of the hole, and a dielectric film and an upper electrode are deposited over the lower electrode. Due to high integration in semiconductor devices, it is difficult to secure a capacitance required in each cell in the limited cell area even with the capacitor having a concave structure. As a result, a capacitor having a cylinder structure has been suggested to provide a larger surface area than that of the capacitor having a concave structure.

The capacitor having a cylinder structure includes a hole where an electrode of the capacitor is formed in an interlayer insulating film, a lower electrode of the capacitor is formed in the inner surface of the hole, the interlayer insulating film is removed, and a dielectric film and an upper electrode are deposited over the residual lower electrode. In the capacitor having a cylinder structure, inner and outer surfaces of the lower electrode can be used as an effective surface of the capacitor to have a larger capacitance than that of the capacitor having a concave structure. As a result, a dip-out process is required when the capacitor having a cylinder structure is formed.

However, the dip-out process is performed by a wet method including a chemical solution. The chemical solution causes leaning and collapse of the lower electrode for storage node. When the lower electrode has a large aspect ratio due to high integration of the semiconductor device, the leaning and collapse of the lower electrode results in degradation of the device.

BRIEF SUMMARY OF THE INVENTION

Embodiments of the present invention are directed to a semiconductor device including a capacitor. According to an embodiment of the present invention, the capacitor includes a lower storage node having a concave structure that surrounds a portion of a storage node contact plug. The capacitor includes forming a recess over the bottom of a storage node region to expose a portion of the storage node contact plug. A lower storage node is formed to have a concave structure that surrounds a portion of the storage node contact plug, thereby preventing leaning and collapse of the lower storage node and increasing a contact area between the lower storage node and the storage node contact plug to improve a contact resistance.

According to an embodiment of the present invention, a semiconductor device includes: a gate formed over a device isolation structure and an active region; a landing plug for a storage node formed between the gates, the landing plug electrically connected to the active region; a storage node contact plug formed over the landing plug, the storage node contact plug electrically connected to the landing plug; and a storage node formed over the storage node contact plug, the storage node comprising a concave structure surrounding a portion of the storage node contact plug.

According to an embodiment of the present invention, a method of fabricating a semiconductor device includes: forming a first interlayer insulating film including a storage node contact plug over a semiconductor substrate; forming a second interlayer insulating film over the first interlayer insulating film and the storage node contact plug; forming a mask pattern over the second interlayer insulating film to expose a storage node region; selectively etching the second interlayer insulating film and the first interlayer insulating film to form a recess exposing a portion of the storage node contact plug; forming a lower storage node in the recess, the storage node including a concave structure surrounding the exposed storage node contact plug; performing a dip-out process to remove the second interlayer insulating film; forming a dielectric film over the semiconductor substrate including the lower storage node; and depositing a plate electrode over the dielectric film to form a capacitor.

DESCRIPTION OF EMBODIMENTS

The present invention relates to a semiconductor device. According to an embodiment of the present invention, the semiconductor device includes a lower storage node having a concave structure that surrounds a portion of a storage node contact plug.

FIGS. 1a to 1g are cross-sectional views illustrating a method of fabricating a semiconductor device according to an embodiment of the present invention. A first etching barrier film 132 and a first interlayer insulating film 134 are formed over a semiconductor substrate 110 including a lower structure having a device isolation structure 120, a source/drain region (not shown), a gate 124 and a landing plug 126. First etching barrier film 132 includes a nitride film, and first interlayer insulating film 134 includes a spin-on-dielectric (SOD) film.

Figure 1A:
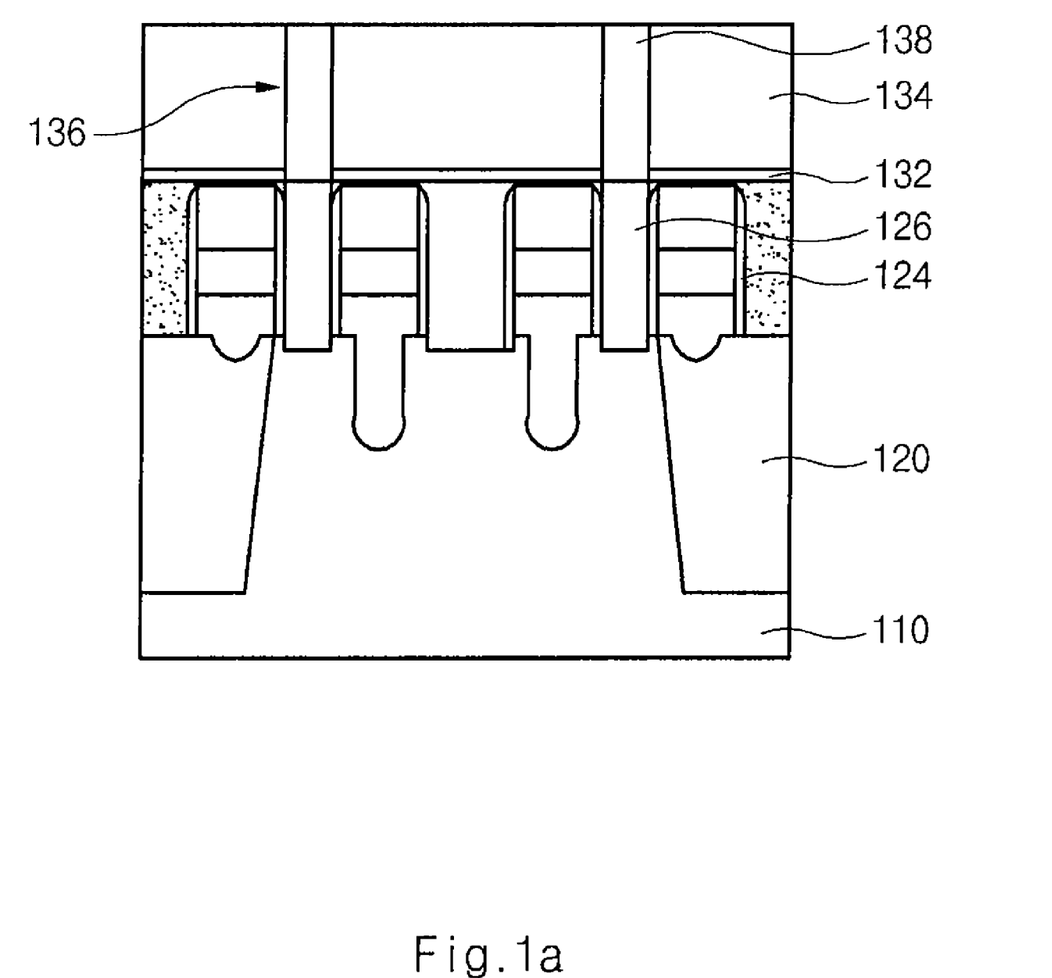
FIGS. 1a to 1g are cross-sectional views illustrating a method of fabricating a semiconductor device according to an embodiment of the present invention.

First interlayer insulating film 134 and first etching barrier film 132 are selectively etched to form a storage node contact hole 136 that exposes landing plug 126. A first conductive layer (not shown) is formed over landing plug 126, first etching barrier film 132 and first interlayer insulating film 134 to fill storage node contact hole 136. A first conductive layer is planarized to expose first interlayer insulating film 134, thereby forming a storage node contact plug 138 in storage node contact hole 136. The first conductive layer is planarized by a chemical mechanical polishing (CMP) method or an etch-back method.

Figure 1B:
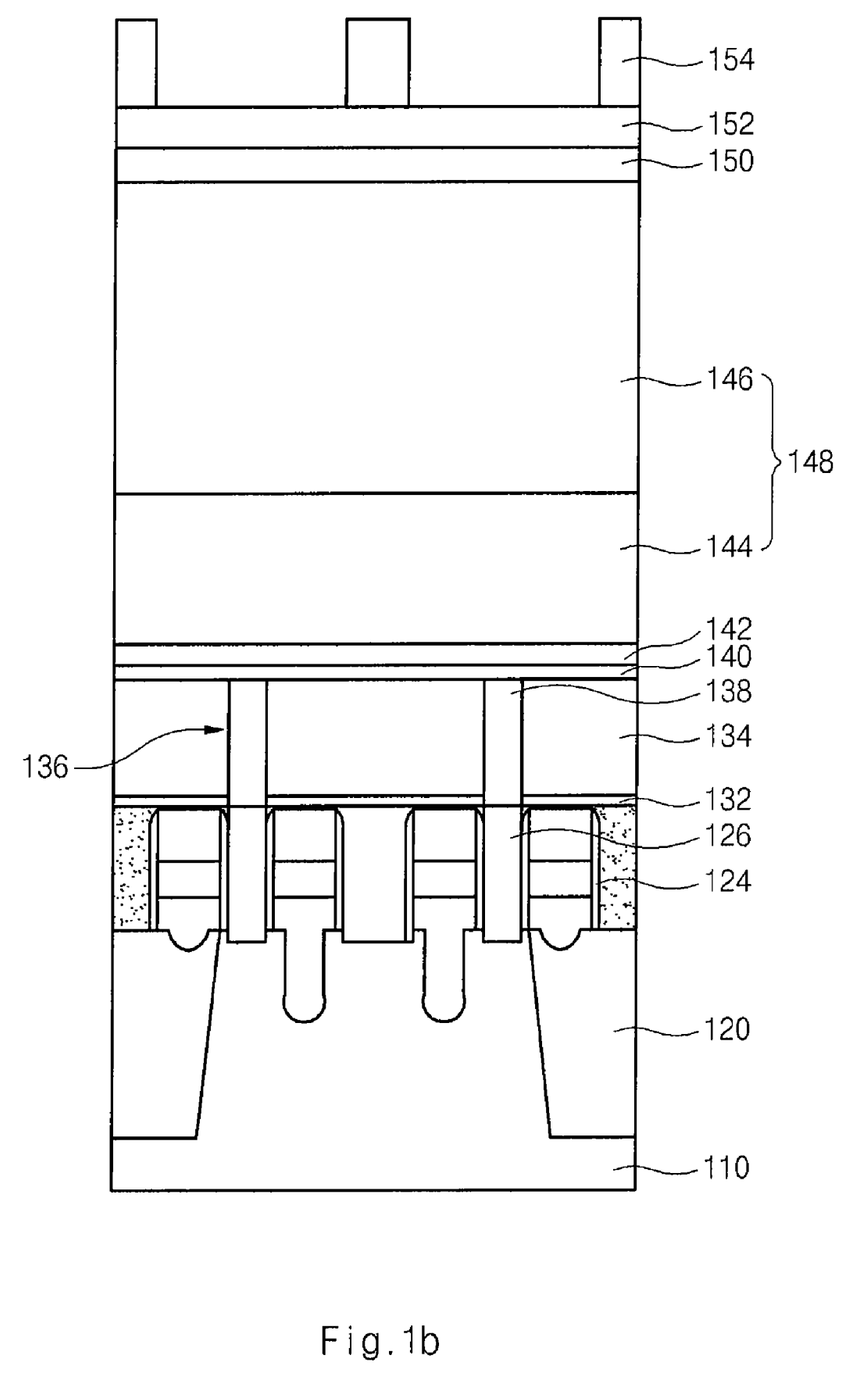

Referring to FIG. 1b, a buffer layer 140 and a second etching barrier film 142 are formed over first interlayer insulating film 134 and storage node contact plug 138. Buffer layer 140 includes a $SiO_2$ film, and second etching barrier film 142 includes a nitride film.

A second interlayer insulating film 148 is formed over second etching barrier film 142. Second interlayer insulating film 148 has a stacked structure including a first insulating film 144 and a second insulating film 146. First insulating film 144 includes a phosphor silicate glass (PSG) oxide film. Second insulating film 146 includes a plasma enhanced tetra-ethyl-ortho-silicate (PE-TEOS) oxide film.

An anti-reflection film 150 and a mask layer 152 are formed over second interlayer insulating film 148. A photoresist film (not shown) is formed over mask layer 152. The photoresist film is exposed and developed using a mask (not shown) that defines a storage node region to form a photoresist pattern 154. Anti-reflection film 150 includes a SiON film, and mask layer 152 includes a carbon layer.

Figure 1C:
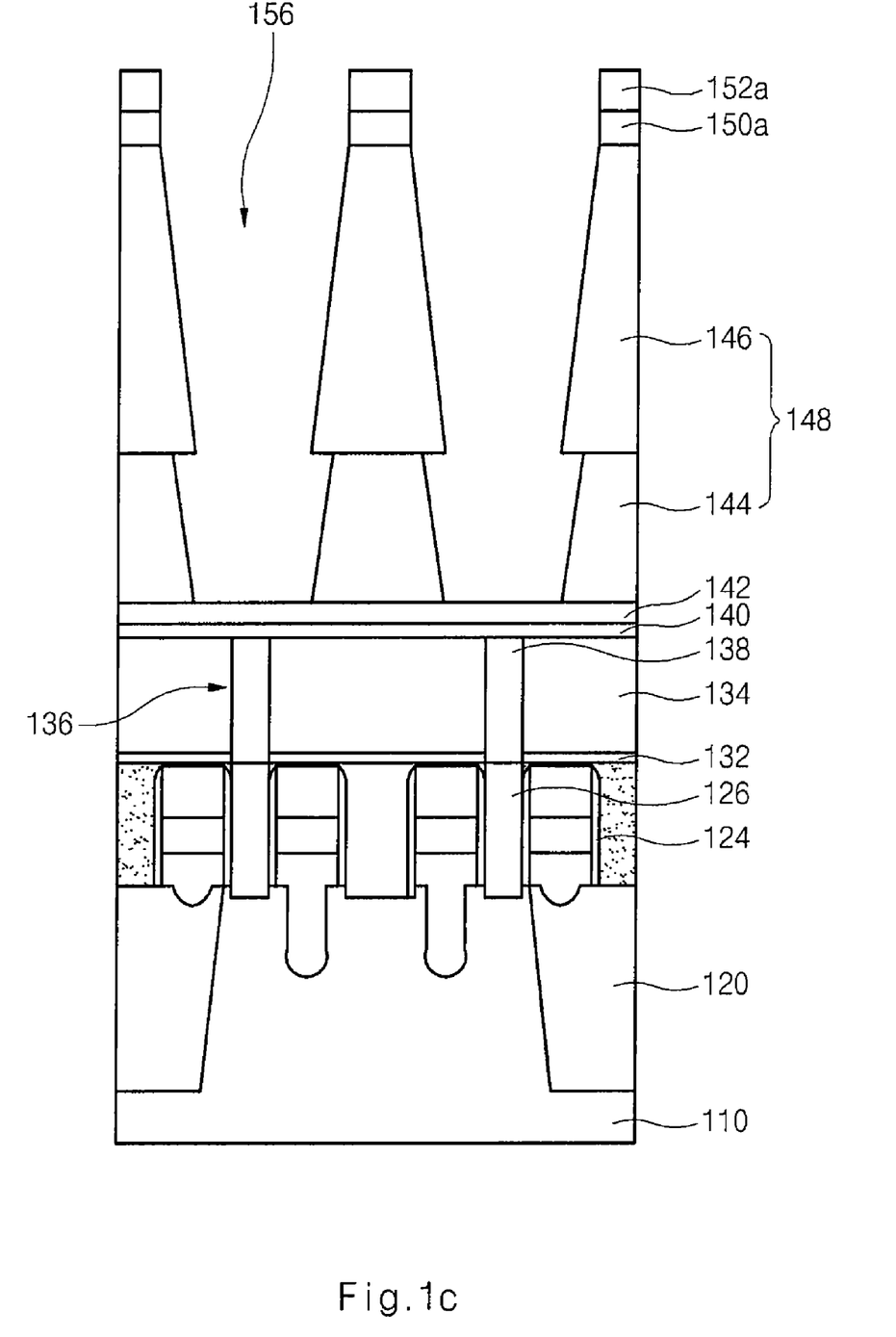

Referring to FIG. 1c, mask layer 152 and anti-reflection film 150 are etched using photoresist pattern 154 of FIG. 1b as an etching mask to form a mask pattern 152a and an anti-reflection pattern 150a. Photoresist pattern 154 is then removed. Second interlayer insulating film 148 is etched using mask pattern 152a and anti-reflection film 150a as an etching mask to form a first recess 156 that exposes second etching barrier film 142. Second interlayer insulating film 148 is isotropic-etched.

Figure 1D:
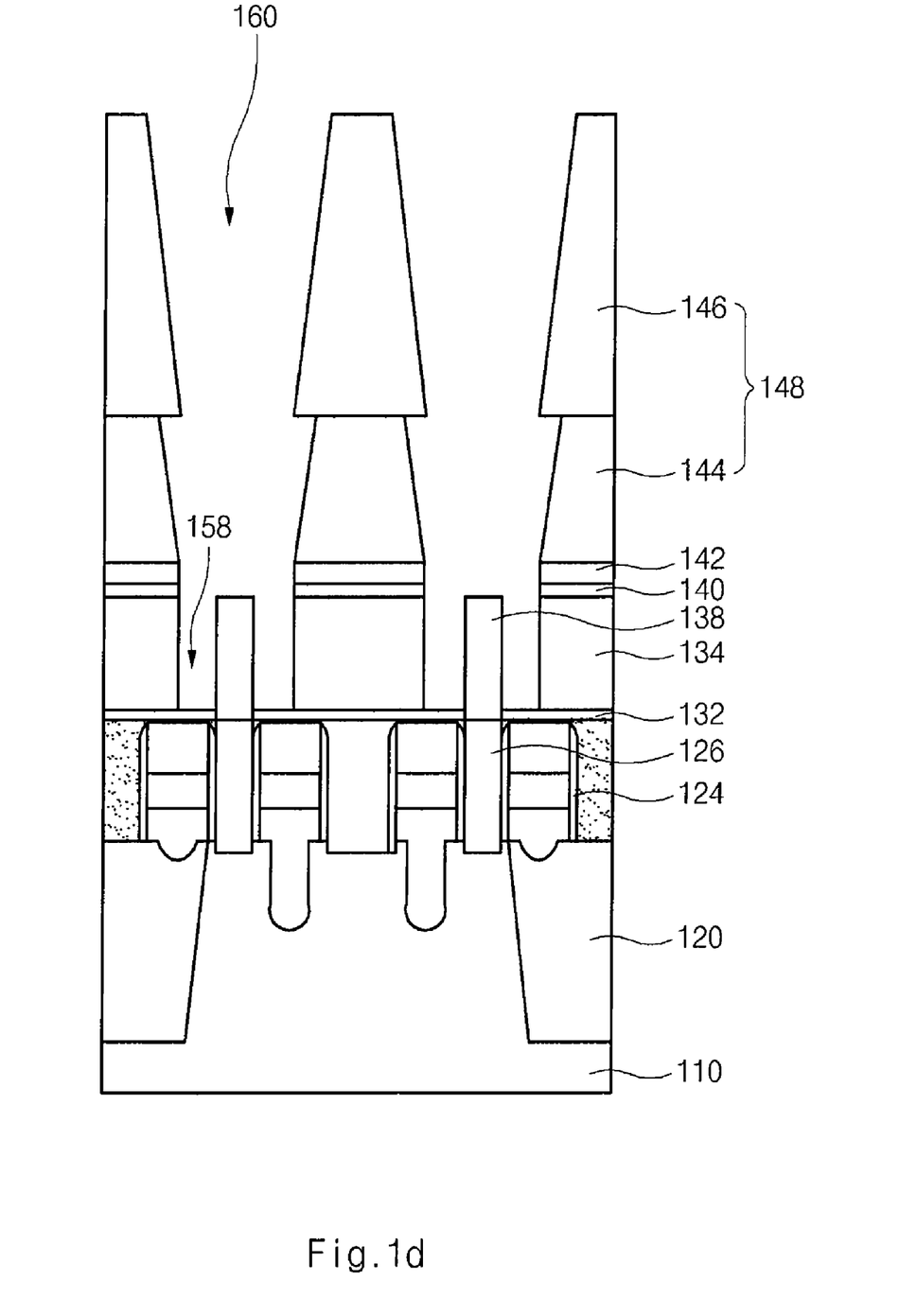

Referring to FIG. 1d, mask pattern 152a and anti-reflection film pattern 150a are then removed. Second etching barrier film 142, buffer layer 140 and first interlayer 134 are selectively etched to form a second recess 158 that exposes storage node contact plug 138. Mask pattern 152 and anti-reflection pattern 150a are removed to form a storage node region 160 defined with first recess 156 and second recess 158. Second etching barrier film 142, buffer layer 140 and first interlayer insulating film 134 are selectively wet-etched with an etching selectivity. After second etching barrier film1 142 is etched, buffer layer 140 and first interlayer insulating film 134 may be etched.

Figure 1E:
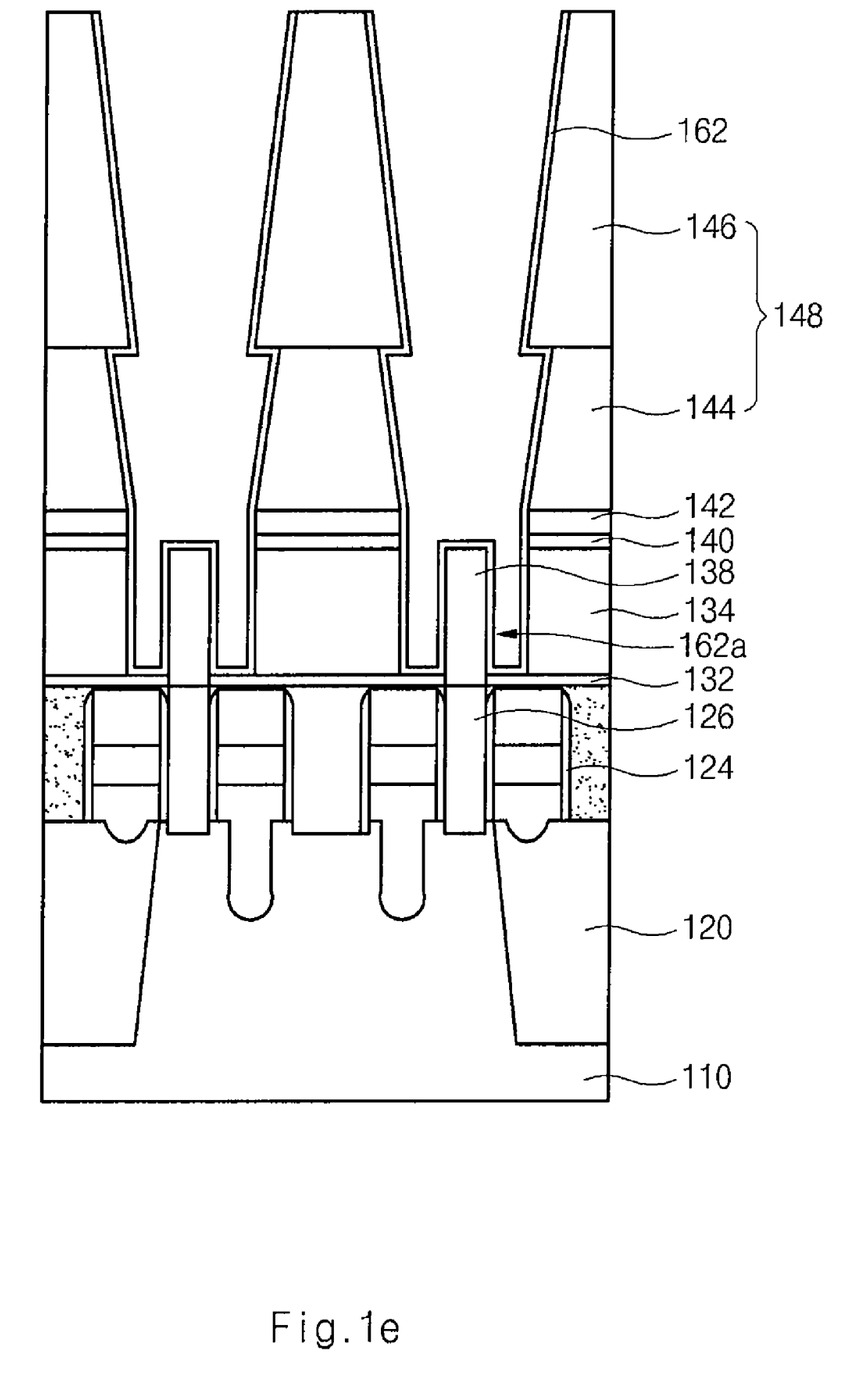

Referring to FIG. 1e, a first conductive layer (not shown) is formed over first etching barrier film 132, storage node contact plug 136 and second interlayer insulating film 148. The first conductive layer includes one layer selected from the group consisting of a titanium (Ti) layer, a titanium nitride (TiN) film, and a combination thereof. The first conductive layer is planarized to expose second interlayer insulating film 148, thereby forming a lower storage node 162. The first conductive layer is planarized by a CMP method or an etch-back method.

Lower storage node 162 has a concave structure 162a that surrounds storage node contact plug 138. Concave structure 162a serves as a support for preventing leaning and collapse of lower storage node 162 during the dip-out process. Concave structure 162a increases the contact area of storage node contact plug 138 and lower storage node 162 to improve a contact resistance.

Figure 1F:
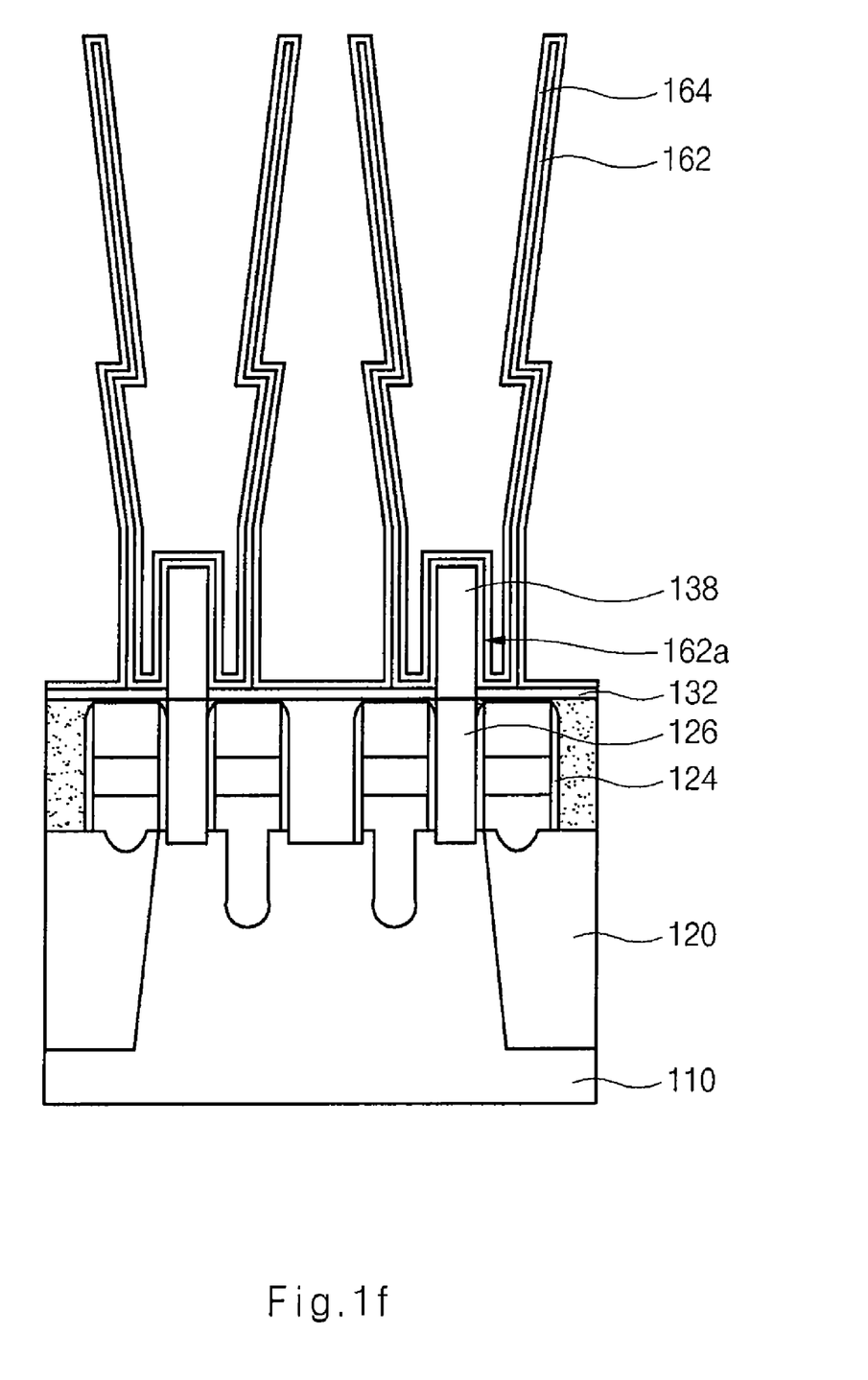
Figure 1G:
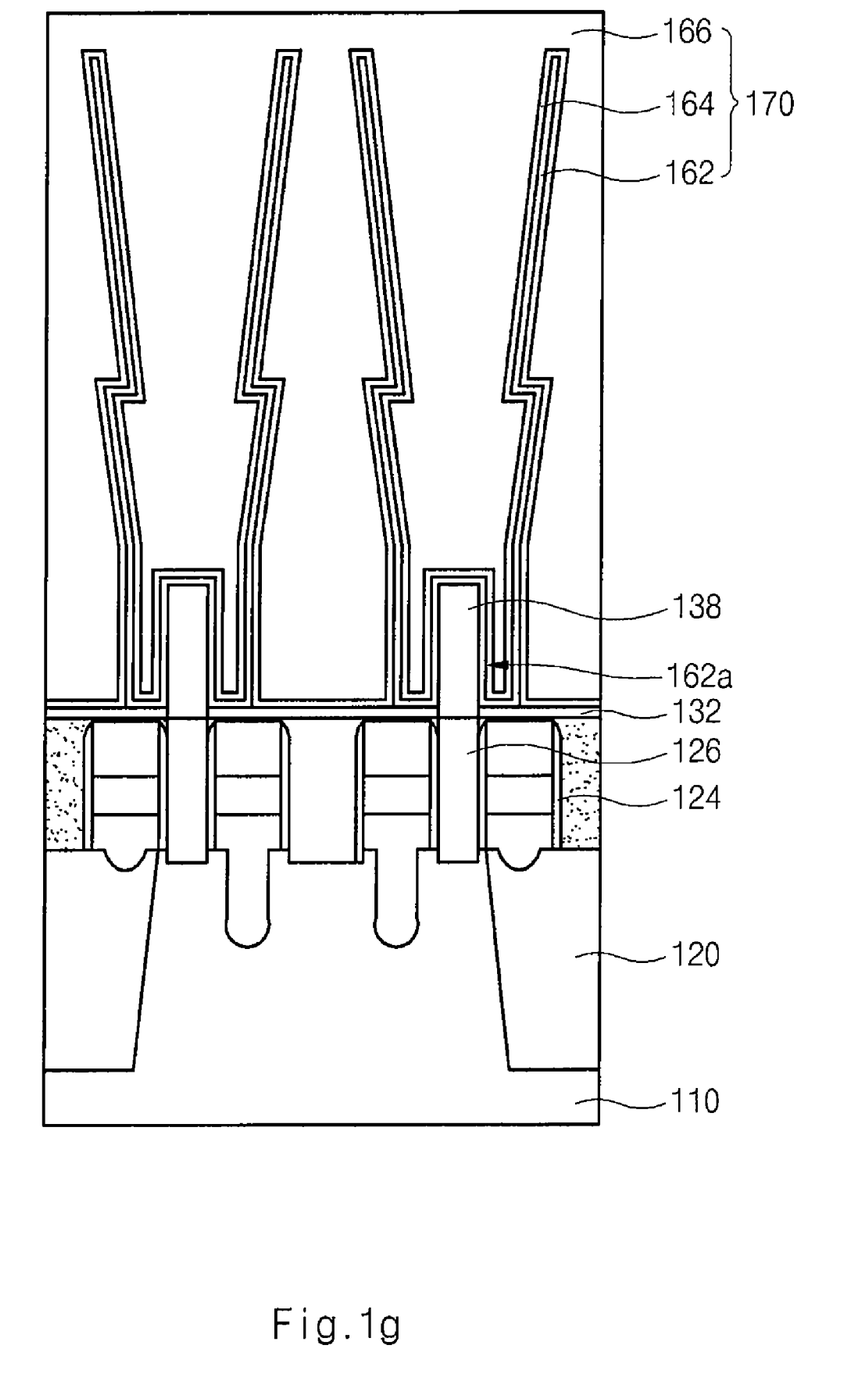

Referring to FIGS. 1f and 1g, the dip-out process is performed to remove second interlayer insulating film 148 to form lower storage node 162 having a cylinder structure. The dip-out process is performed by a wet etching method. A dielectric film 164 is formed over lower storage node 162 and second etching barrier film 142. A plate electrode 166 is formed over dielectric film 164 to form a capacitor 170 having a stacked structure including lower storage node 162, dielectric film 164 and plate electrode 166. Subsequent processes may be performed using well known processes such as a process of forming metal lines to obtain a transistor.

As described above, according to an embodiment of the present invention, a lower storage node is formed to have a concave structure where a portion of a storage node contact plug is overlapped, thereby strengthening the lower structure of the lower storage node to prevent collapse of the storage node. The side surface of the storage node contact plug is used as a lower storage node to increase an effective area of the storage node. Accordingly, more capacitance of the storage node can be secured. The concave structure increases a contact area between the lower storage node and the storage node contact plug to reduce a contact resistance. As a result, the operation speed of the device is improved to improve reliability of the device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device, the method comprising:
    forming an etch stop film over a semiconductor substrate;
    forming a first interlayer insulating film including a storage node contact plug over the etch stop film;
    forming a second interlayer insulating film over the first interlayer insulating film and the storage node contact plug;
    forming a mask pattern over the second interlayer insulating film to expose a storage node region;

selectively etching the second interlayer insulating film and the first interlayer insulating film until the etch stop film is exposed to form a recess exposing an upper surface and a sidewall of the storage node contact plug;

forming a lower storage node in the recess, the storage node including a concave structure surrounding the exposed storage node contact plug;

performing a dip-out process to remove the second interlayer insulating film;

forming a dielectric film over the lower storage node; and depositing a plate electrode over the dielectric film to form a capacitor.

2. The method of claim 1, wherein the first interlayer insulating film comprises a spin-on-dielectric (SOD) film.

3. The method of claim 1, wherein the second interlayer insulating film is a phospho silicate glass (PSG) oxide film, a plasma enhanced tetra-ethyl-ortho-silicate (PE-TEOS) oxide film, or a combination thereof.

4. The method of claim 1, wherein the first interlayer insulating film is wet-etched using a given etch selectivity.

* * * * *